(12) United States Patent
Noquil et al.

(10) Patent No.: US 7,256,479 B2
(45) Date of Patent: Aug. 14, 2007

(54) METHOD TO MANUFACTURE A UNIVERSAL FOOTPRINT FOR A PACKAGE WITH EXPOSED CHIP

(75) Inventors: Jonathan A. Noquil, Surigao del Sur (PH); Connie Tangpuz, Lapu-Lapu (PH); Romel Manatad, Mandaue (PH); Stephen Martin, South Portland, ME (US); Rajeev Joshi, Cupertino, CA (US); Venkat Iyer, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 84 days.

(21) Appl. No.: 11/035,918

(22) Filed: Jan. 13, 2005

(65) Prior Publication Data

US 2006/0151861 A1    Jul. 13, 2006

(51) Int. Cl.
*H01L 23/495* (2006.01)

(52) U.S. Cl. .................................................. 257/666

(58) Field of Classification Search ........ 257/666–667, 257/678, E23.042, E23.045, E23.049, E23.052, 257/E33.06
See application file for complete search history.

(56) References Cited

U.S. PATENT DOCUMENTS

| | | | |
|---|---|---|---|
| 5,105,536 A | 4/1992 | Neugebauer et al. | |
| 5,250,841 A | 10/1993 | Sloan et al. | |
| 5,319,242 A | 6/1994 | Carney et al. | |
| 6,198,163 B1 | 3/2001 | Crowley et al. | |
| 6,215,176 B1 | 4/2001 | Huang | |
| 6,307,755 B1 | 10/2001 | Williams et al. | |
| 6,356,234 B1 | 3/2002 | Harrison et al. | |
| 6,384,492 B1 | 5/2002 | Iversen et al. | |
| 6,399,418 B1 | 6/2002 | Glenn et al. | |
| 6,448,110 B1 | 9/2002 | Chen et al. | |
| 6,452,278 B1 | 9/2002 | DiCaprio et al. | |
| 6,628,880 B2 | 9/2003 | Roberts | |
| 6,720,642 B1 | 4/2004 | Joshi et al. | |
| 6,723,620 B1 | 4/2004 | Pavier | |
| 6,867,481 B2 * | 3/2005 | Joshi et al. ................. 257/666 |
| 7,049,684 B2 * | 5/2006 | Minamio et al. ............ 257/666 |
| 2002/0066950 A1 | 6/2002 | Joshi | |
| 2002/0066959 A1 | 6/2002 | Joshi | |
| 2002/0100962 A1 | 8/2002 | Joshi | |
| 2002/0192935 A1 | 12/2002 | Joshi | |
| 2003/0011005 A1 | 1/2003 | Joshi | |
| 2003/0025183 A1 | 2/2003 | Thornton et al. | |
| 2003/0042403 A1 | 3/2003 | Joshi | |
| 2003/0042581 A1 * | 3/2003 | Fee et al. .................... 257/666 |
| 2003/0075786 A1 | 4/2003 | Joshi et al. | |
| 2003/0107126 A1 | 6/2003 | Joshi | |
| 2003/0122247 A1 | 7/2003 | Joshi | |

(Continued)

FOREIGN PATENT DOCUMENTS

JP    01-134958    5/1989

*Primary Examiner*—Nathan W. Ha
(74) *Attorney, Agent, or Firm*—Townsend and Townsend and Crew LLP

(57) ABSTRACT

A semiconductor die package is disclosed. It may include a semiconductor die having a first surface and a second surface, and a leadframe structure. A molding material may be formed around at least a portion of the die and at least a portion of the leadframe structure. A solderable layer may be on the exterior surface of the molding material and the first surface of the semiconductor die.

17 Claims, 14 Drawing Sheets

U.S. PATENT DOCUMENTS

| | | |
|---|---|---|
| 2003/0173684 A1 | 9/2003 | Joshi |
| 2003/0193080 A1* | 10/2003 | Cabahug et al. ............ 257/666 |
| 2003/0197278 A1 | 10/2003 | Joshi et al. |
| 2004/0041242 A1 | 3/2004 | Joshi |
| 2004/0056364 A1 | 3/2004 | Joshi |
| 2004/0088448 A1 | 5/2004 | Joshi et al. |
| 2004/0125573 A1 | 7/2004 | Joshi et al. |
| 2004/0137724 A1 | 7/2004 | Joshi |
| 2004/0159939 A1 | 8/2004 | Joshi |
| 2004/0164386 A1 | 8/2004 | Joshi |
| 2004/0178481 A1 | 9/2004 | Joshi |
| 2004/0191955 A1 | 9/2004 | Joshi |
| 2004/0201081 A1 | 10/2004 | Joshi |
| 2004/0201086 A1 | 10/2004 | Joshi |
| 2004/0207052 A1 | 10/2004 | Joshi et al. |
| 2004/0232528 A1* | 11/2004 | Ito et al. .................... 257/666 |
| 2004/0241977 A1 | 12/2004 | Joshi |
| 2005/0012225 A1 | 1/2005 | Choi et al. |
| 2005/0051878 A1 | 3/2005 | Granada |

* cited by examiner

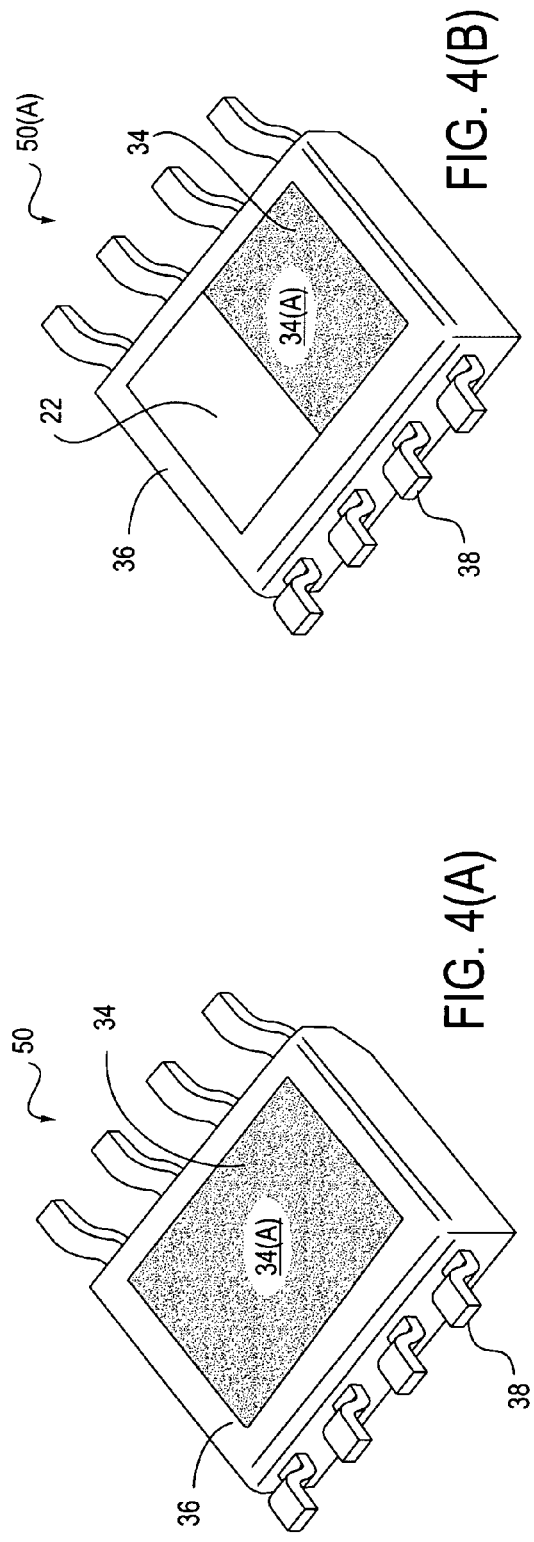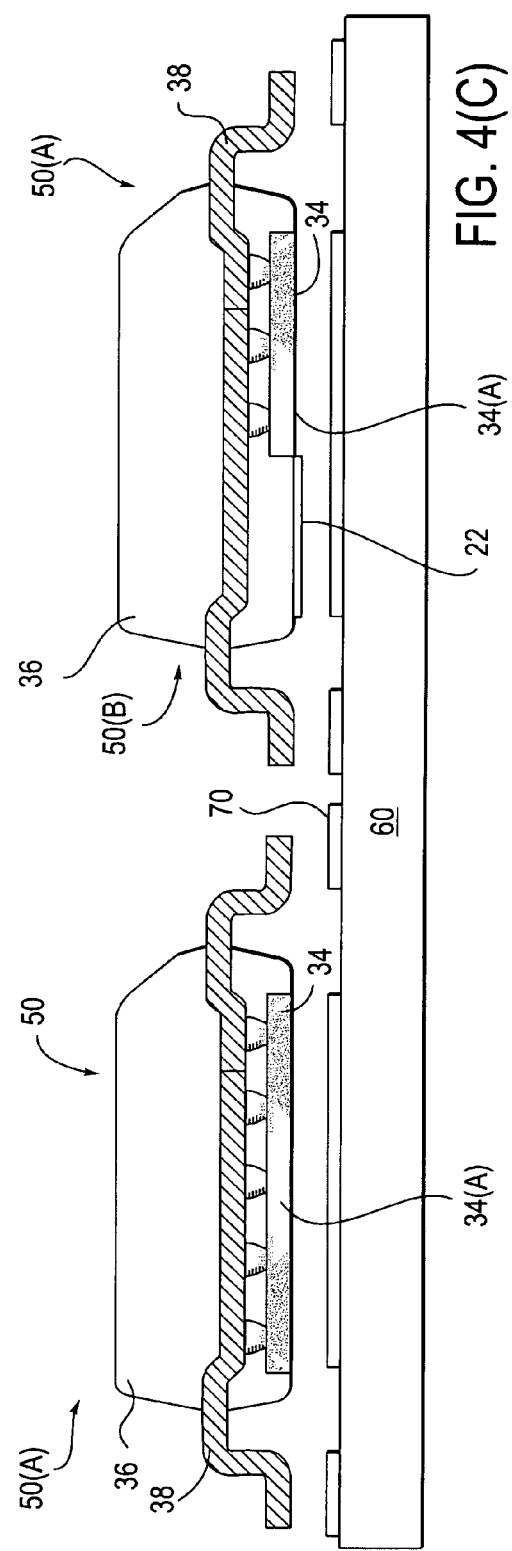

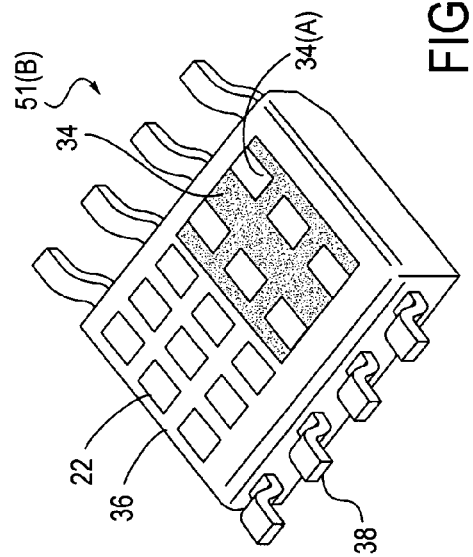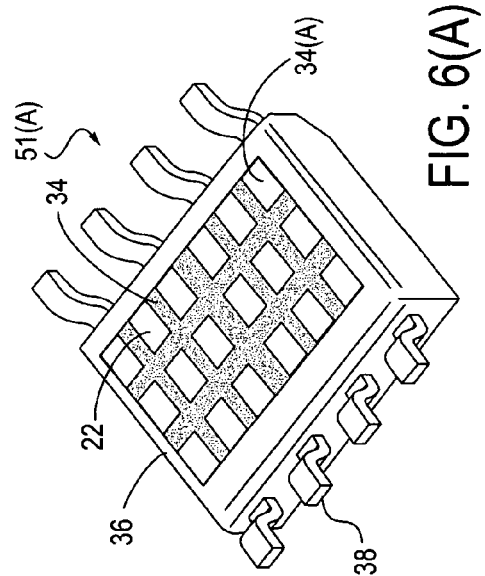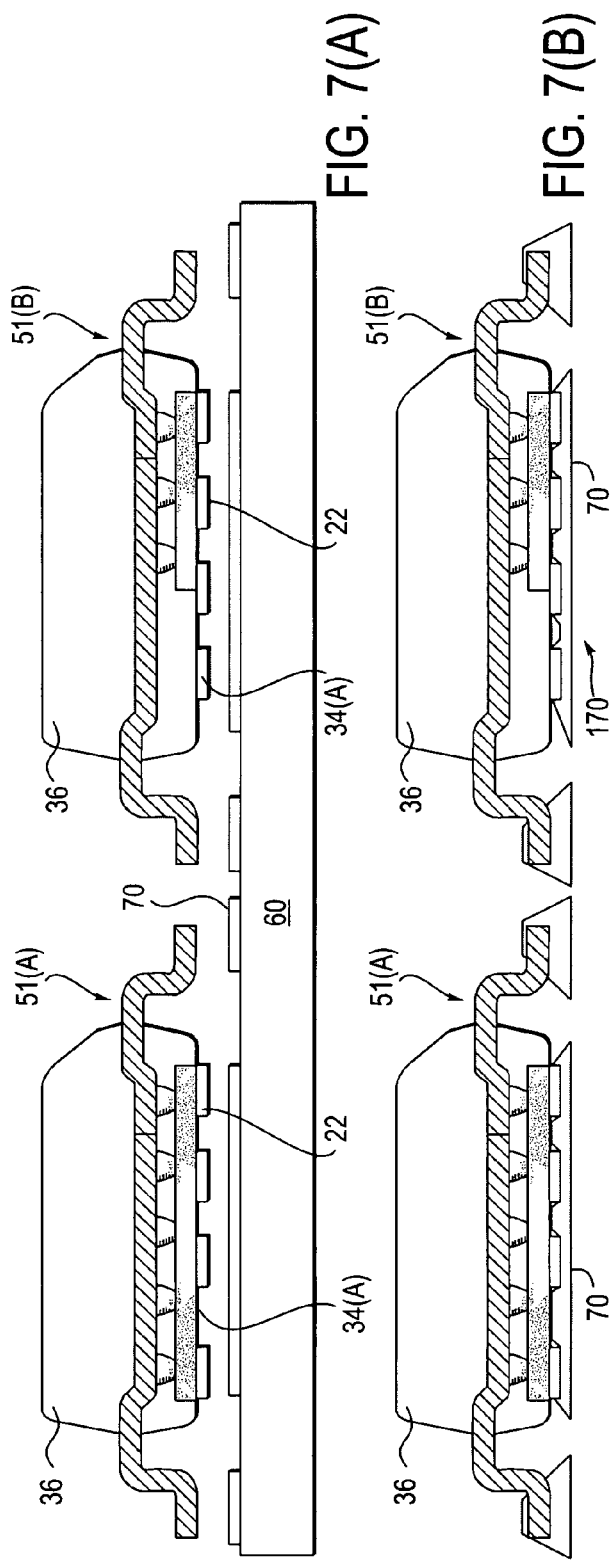

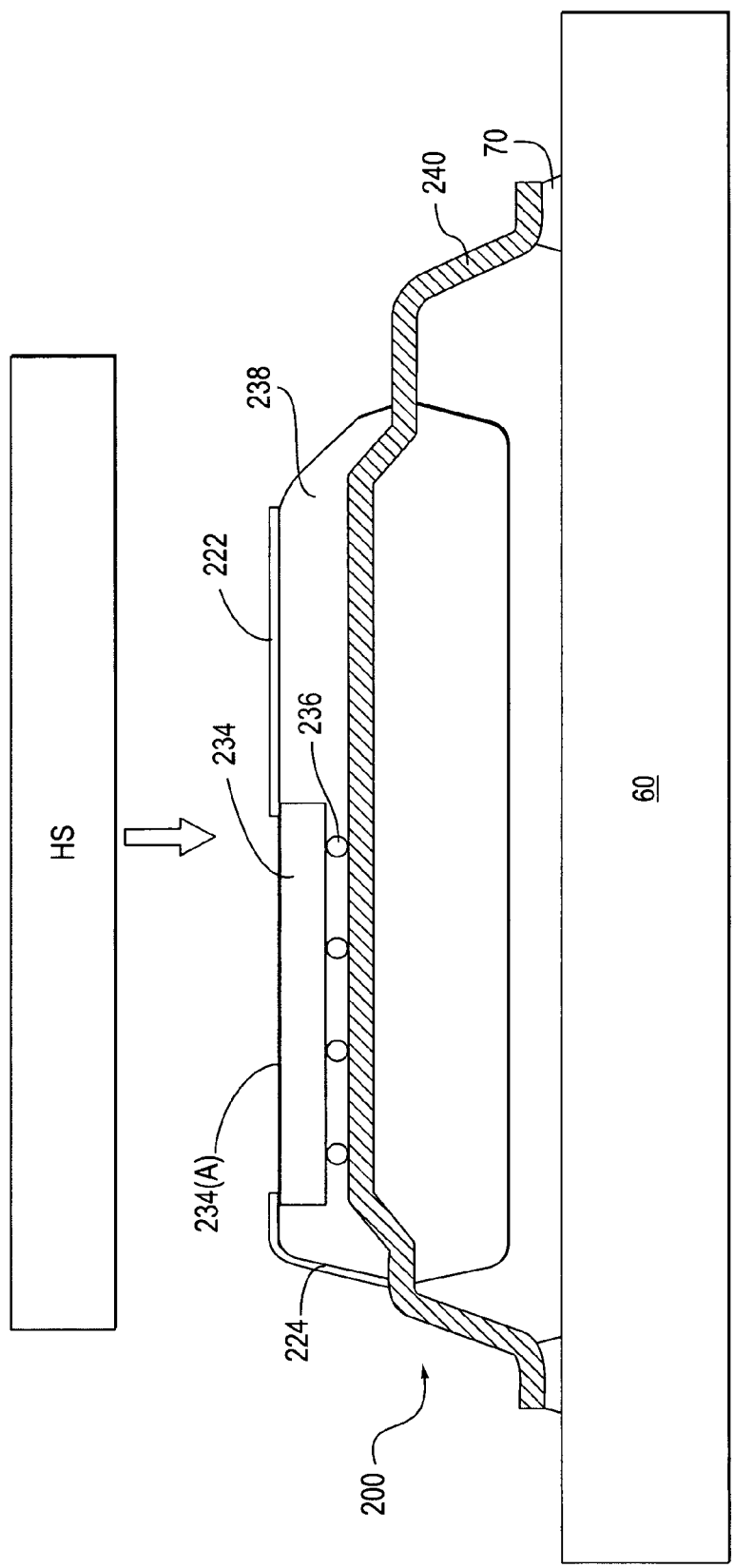

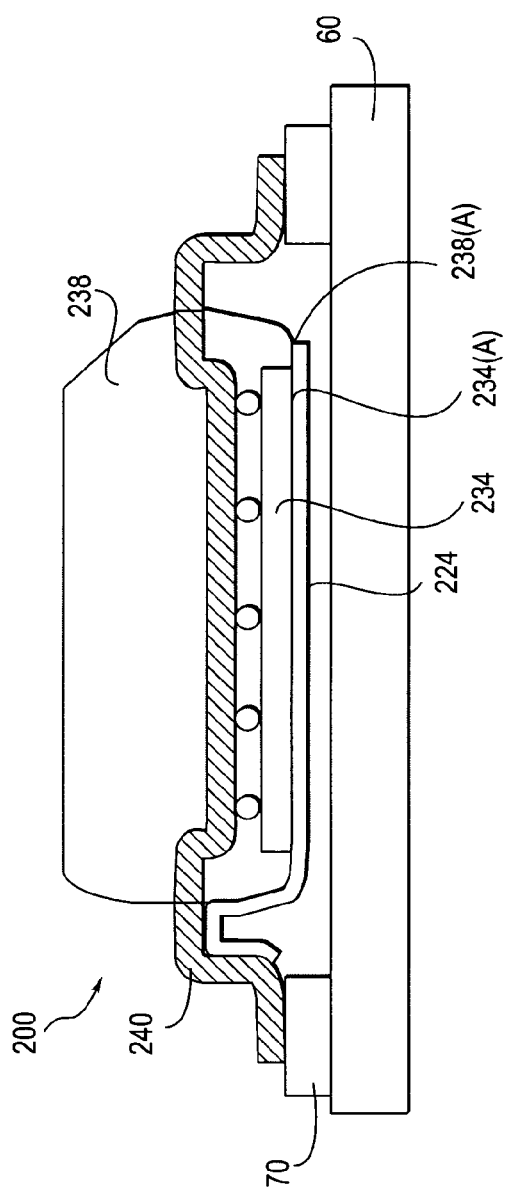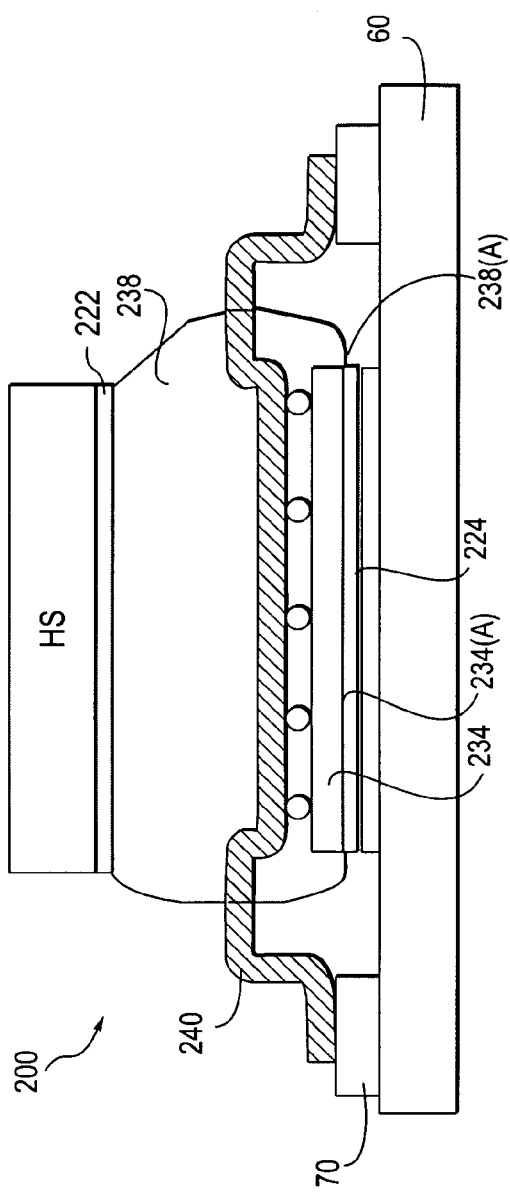

METHOD TO MANUFACTURE A UNIVERSAL FOOTPRINT FOR A PACKAGE WITH EXPOSED CHIP

CROSS-REFERENCES TO RELATED APPLICATIONS

Not applicable

BACKGROUND OF THE INVENTION

The FLMP (flip chip in leaded molded package) is a significant packaging technology being developed in the power MOSFET packaging field. Its electrical and thermal performance remains unsurpassed in the industry. It uses flip chip MOSFET technology on a leadframe (with gate and source connections). The backside of the die is exposed in the package. In some cases, the exposed backside of the die may serve as a drain terminal for the package.

While FLMP type packages are desirable, the dice in FLMP type packages may vary in size. This results in die packages with variable footprints. In some cases, the footprint is determined by the amount of solderable surface needed to mount the package on a circuit board. It would be desirable if packages with different die sizes could be produced, while having a "universal" footprint instead of different footprints.

Embodiments of the invention address this and other problems, individually and collectively.

SUMMARY OF THE INVENTION

Embodiments of the invention are directed to semiconductor die packages, electrical assemblies, and methods.

One embodiment of the invention is directed to a semiconductor die package comprising: a semiconductor die having a first surface and a second surface; a leadframe structure, wherein the semiconductor die is coupled to the leadframe structure; a molding material formed around at least a portion of the die and at least a portion of the leadframe structure, and having an exterior surface, wherein the first surface of the semiconductor die is substantially flush with the exterior surface of the molding material; and a solderable layer on the exterior surface of the molding material.

Another embodiment of the invention is directed to a method comprising: providing a semiconductor die having a first surface and a second surface; attaching the semiconductor die to a leadframe structure, wherein the semiconductor die is coupled to the leadframe structure; forming a molding material around at least a portion of the die and at least a portion of the leadframe structure, wherein the formed molding material includes an exterior surface, and wherein the first surface of the semiconductor die is substantially flush with the exterior surface of the molding material; and forming a solderable layer on the exterior surface of the molding material.

Other embodiments are directed to electrical assemblies.

These and other embodiments are described in further detail below.

BRIEF DESCRIPTION OF THE DRAWINGS

FIGS. 3(A)-3(D), 4(A) and 4(B) show bottom perspective views of die packages.

FIG. 4(C) shows side cross-sectional views of the die packages in FIGS. 4(A) and 4(B) being mounted on a circuit board.

FIGS. 6(A) and 6(B) show bottom perspective views of die packages.

FIGS. 7(A) and 7(B) show side cross-sectional views of the packages in FIGS. 6(A) and 6(B) when they are mounted on a circuit board.

FIG. 11 shows a side cross-sectional view of a die package with the exposed surface of the die being at the top of the die package rather than at the bottom of the die package.

FIG. 12 shows a side cross-sectional view of a die package according to another embodiment of the invention.

FIG. 13 shows a side-cross-sectional view of a die package according to another embodiment of the invention where a heat sink is attached to a top surface of a die package.

DETAILED DESCRIPTION

Figure 1:
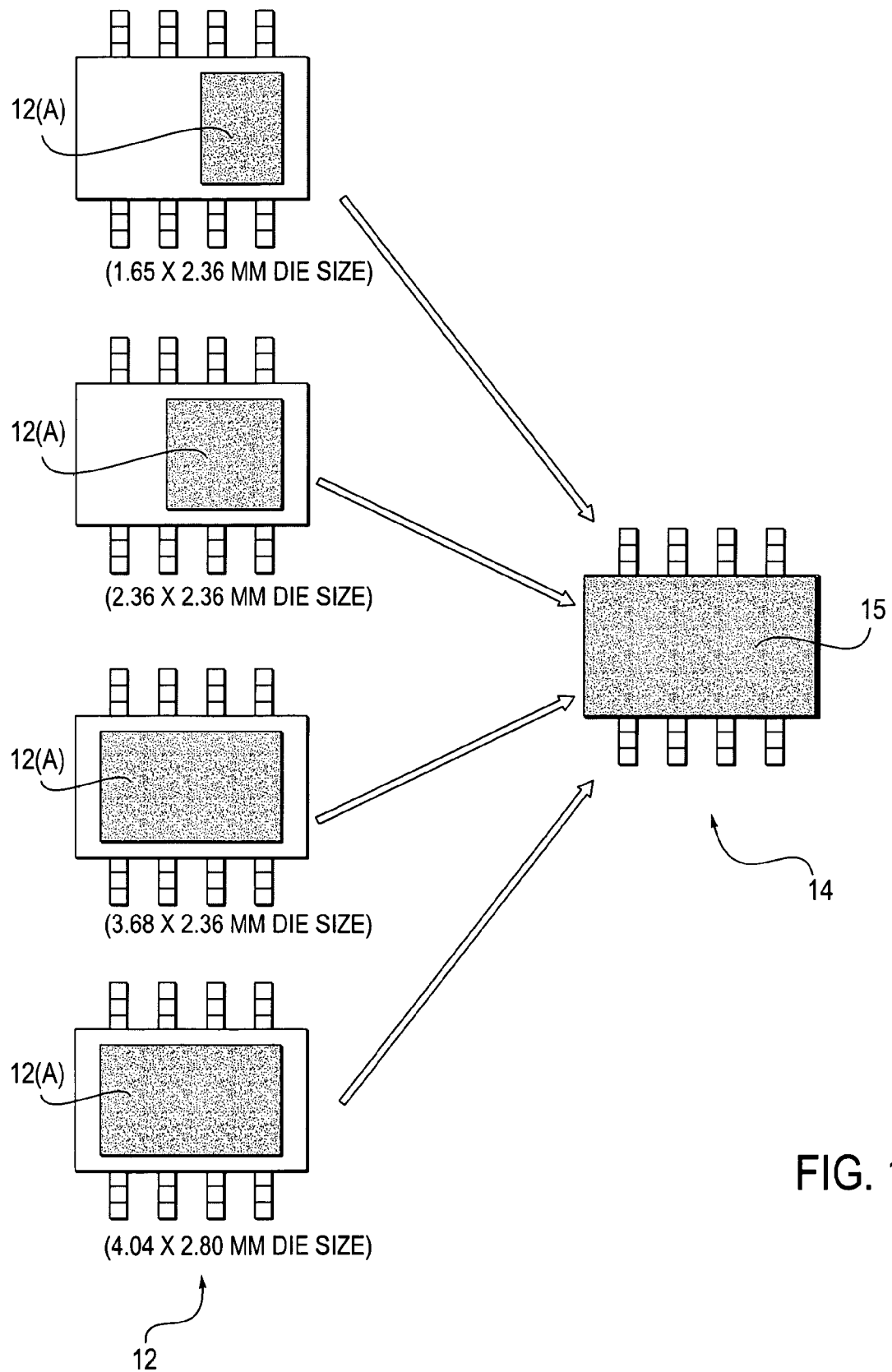
FIG. 1 shows different semiconductor die packages with different exposed die surfaces.

Embodiments of the invention are directed to methods for making semiconductor die packages, die packages, and electrical assemblies.

An exemplary semiconductor die package according to an embodiment of the invention can have a semiconductor die that includes a metallized backside that is exposed through a molding material in the package. A solderable layer is formed on molding material to increase the solderable area of the die package. By forming a solderable layer on a die package, a universal footprint (i.e., a footprint that corresponds to the footprints associated with other die packages) can be established regardless of the lateral dimensions of the die in the die package.

The solderable layer can be formed on the molding material in the package after the molding material is molded. The solderable layer may cover some or all of the bottom (or top) side of the package. It may or may not make contact to the surface of the die that is exposed through the molding material. It can also serve as an interconnecting medium between the exposed metallized backside of the die and a conductive pad on a PCB (printed circuit board). Solder or a conductive adhesive may be used to couple the solderable layer in the die package to the PCB. A top solderable layer could facilitate external heat sink attach.

The solderable layer may be formed using any suitable processes. For example, the solderable layer may be formed by processes including sputtering, evaporation, screen printing, pad printing and/or plating (e.g., electroless plating or electroplating). In one specific example, the solderable layer may be formed by sputtering a seed layer on the molding material in the package. After sputtering, metal may be plated on the seed layer. Blanket processes such as sputtering or evaporation may use a mask to deposit the conductive material on selected areas of the die package, or may use a post deposition removal process to remove the deposited conductive material from unwanted areas.

The solderable layer may also be formed of one or more sublayers. For example, the solderable layer may comprise an adhesion sublayer and a solderable interface sublayer on top of the adhesion sublayer. The sublayers may be formed using the same or different processes.

The solderable layer may comprise any suitable material. For example, the solderable layer may comprise a conductive ink. Conductive inks are preferably used in the solderable layer, since conductive inks have good adherence to molded plastic materials. Conductive inks typically comprise conductive particles in a carrier medium. The conductive particles may comprise noble metals such as Ag, Au, Pd, Pt, and alloys thereof, and/or transition metals such as Sn, Cu, and alloys thereof. The carrier medium may comprise a thermosetting resin such as an epoxy resin. Suitable conductive inks are commercially available from Dow Corning (e.g., Dow Corning PI 2000 and PI 2200) and other conductive ink manufacturers. Such conductive inks are typically deposited and then cured using, for example, a reflow oven.

While conductive inks have good electrical properties, some conductive inks may not be directly solderable. In such cases, it may be desirable to plate the ink with a solderable interface metal such as Sn to form a solderable interface layer. In this case, the solderable layer may comprise a cured conductive ink layer and a deposited metal layer. Barrier metals such as nickel may be used between the deposited and cured conductive ink sublayer and the solderable interface layer.

The solderable layer may also have any suitable form. For example, as will be shown in the examples below, the solderable layer may be continuous or discontinuous. It may also have a thickness less than about 100 microns in some embodiments. For example, the solderable layer may have a thickness between about 10 and 30 microns.

The dice in the semiconductor die packages preferably include vertical power transistors. Vertical power transistors include VDMOS transistors and vertical bipolar power transistors. A VDMOS transistor is a MOSFET (metal oxide semiconductor field effect transistor) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. In other embodiments, the transistors in the semiconductor dice can be bipolar transistors such as IGBTs (insulated gate bipolar transistors). In such embodiments, one side of the semiconductor die can have an emitter region and a base region. The other side of the die can have a collector region.

The molding material that is used in the die packages according to embodiments of the invention may comprise any suitable material and may be molded into any suitable form in the die packages. Suitable molding materials may include thermosetting resins such as epoxy resins.

Specific package embodiments are shown in the Figures.

FIG. 1 shows bottom plan views of various semiconductor die packages with exposed die surfaces. On the left side, there are four die packages 12 with four different exposed die surfaces 12(A) corresponding to dice with different sizes. The different sizes constitute different solderable areas and therefore different "footprints". Using embodiments of the invention, the die packages 12 with different sized dice can be coated with a solderable layer 15 to form die packages 14 with the same or substantially the same footprint.

Creating die packages with uniform solderable footprints has a number of advantages. First, by providing the die packages with the same or substantially the same footprint, an electronics manufacturer can use a circuit board with uniformly sized conductive pads. Specialized pads to accommodate die packages with different solderable footprints are not needed. Second, using die packages with different footprints can cause manufacturing problems if an electronics manufacturer has only one type of solder stencil mask. The stencil mask may be adapted to form solder deposits of a single size. If too much solder is placed on the conductive land of a circuit board and if the solder contacts a non-solderable area such as the molding material in the die package, the solder may wick towards the solderable exposed die surface and will not wet to the molding material. This may cause some solder to flow outward towards the leads of the package, thereby increasing the risk of shorting the leads and increasing the risk of producing defective electronic parts.

FIGS. 2(A)-2(H) show the process steps that can be used to make a die package with an exposed die surface. Exemplary process steps can also be found in U.S. Pat. No. 6,720,642, which is herein incorporated by reference in its entirety, and is assigned to the same assignee as the present application.

Figure 2A:
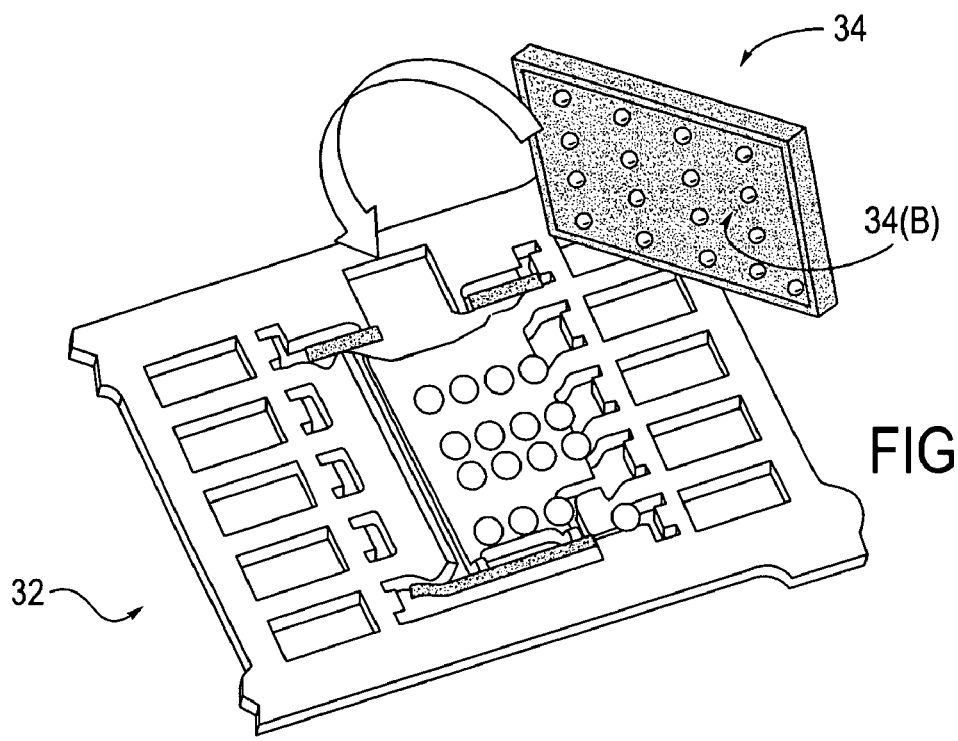
FIGS. 2(A)-2(H) show process steps in the formation of a semiconductor die package with an exposed die surface.

As shown in FIG. 2(A), a solder-bumped semiconductor die 34 is mounted on the die attach region of a leadframe structure 32. The leadframe structure 32 may comprise a conductive metal such as copper and may or may not be plated with other metals.

The leadframe structure 32 may include a gate lead structure and a source lead structure. Each of the gate lead structure and the source lead structure may have one or more leads extending therefrom. Portions of the gate lead structure and the source lead structure may form a die attach region of the leadframe structure 32. The die attach region is the area of the leadframe structure 32 where a die is attached.

As shown in FIG. 2(A), bumps are on a second surface 34(B) of the die 34. The die 34 is flipped over and then mounted on the die attach region of the leadframe structure 32. The bumps on the die 34 may comprise a Pb or Sn based solder, and may be in the form of solder balls, columns, etc., or may in the form of wire bond studs with are covered with a solderable material. Wirebond studs are described in U.S. patent application Ser. No. 10/386,211, filed on Mar. 10, 2003, which is herein incorporated by reference in its entirety. Exemplary studs may include copper with an outer oxidation resistant layer comprising a noble metal. Referring to FIG. 2(A), the solder bumps may connect to source and gate regions at the second surface 34(B) of the die 34. Solder may also be present on the die attach region of the leadframe structure 32 prior to attaching the solder-bumped semiconductor die 34 to the leadframe structure 32.

Figure 2B:
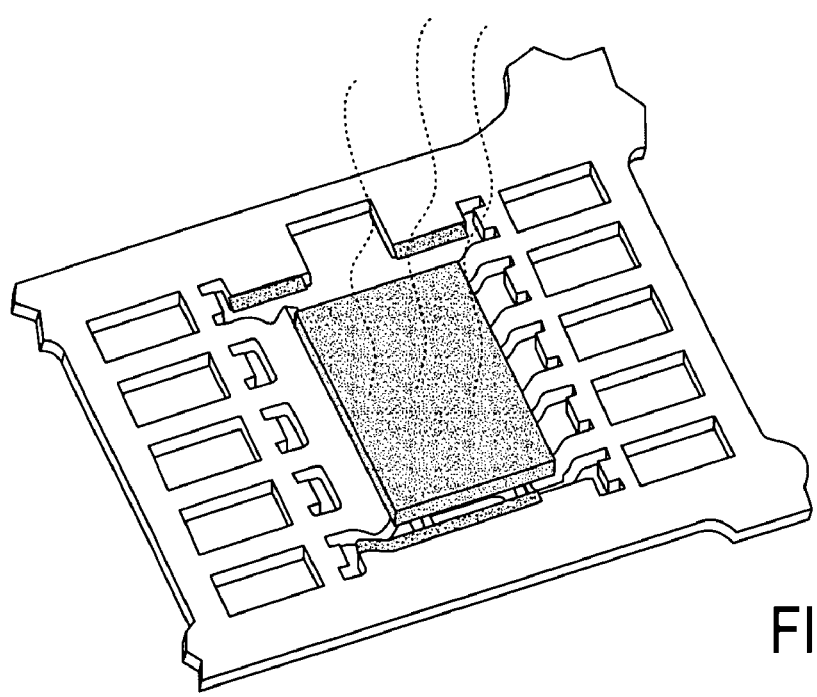

As shown in FIG. 2(B), after the die 34 is mounted on the leadframe structure 32, a solder reflow process is then performed. The solder reflow process reflows the solder bumps on the semiconductor die 34 so that the semiconductor die 34 adheres to the leadframe structure 32. The reflow process may be a "no collapse" process where the solder bumps do not collapse during reflow. Suitable reflow temperatures and conditions are known to those of ordinary skill in the art.

Figure 2C:
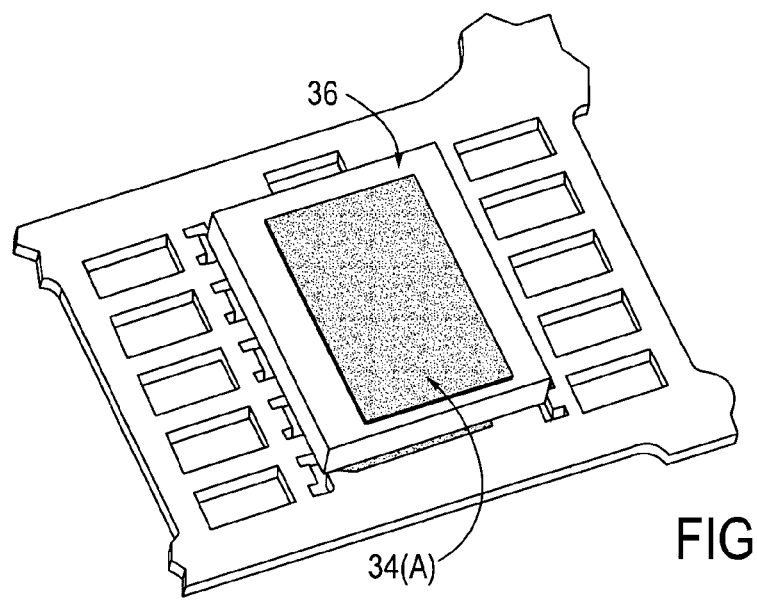
Figure 2D:
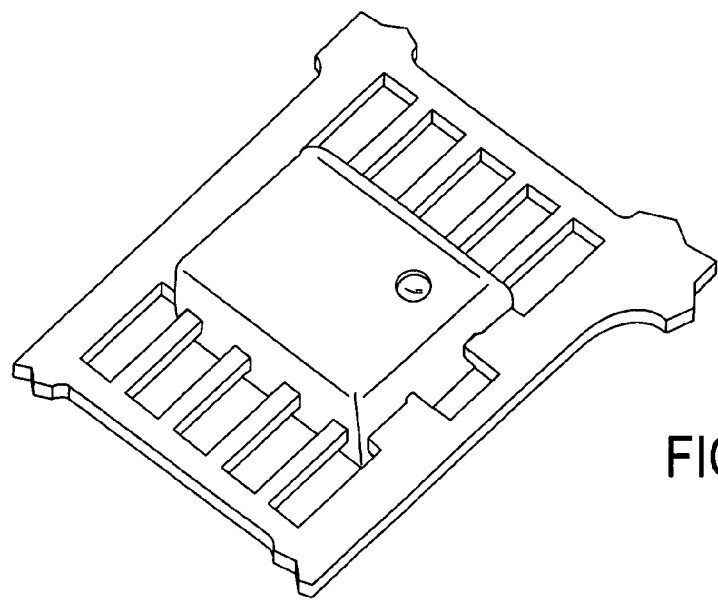

FIG. 2(C) shows a bottom perspective view of a forming package, while FIG. 2(D) shows the top view of a forming package. As shown in FIG. 2(C), a molding material 36 is formed around the die 34. A first surface 34(A) of the die 34 is exposed through the molding material 36. The first surface 34(A) may correspond to a drain region of a MOSFET in the die 34. However, the first surface 34(A) may correspond to any suitable input or output terminal in other embodiments.

In exemplary molding process, tape (not shown) may be placed on the first surface 34(A) of the die 34 (as shown in FIG. 2(B)). The taped die may be placed in a molding chamber. Molding material may be formed around the die 34 and solidified. After molding, the tape is removed. The formed die package has a molding material with an exterior surface that is substantially flush with the exposed die surface 34(A). Suitable molding conditions may be determined by those of ordinary skill in the art.

Figure 2E:
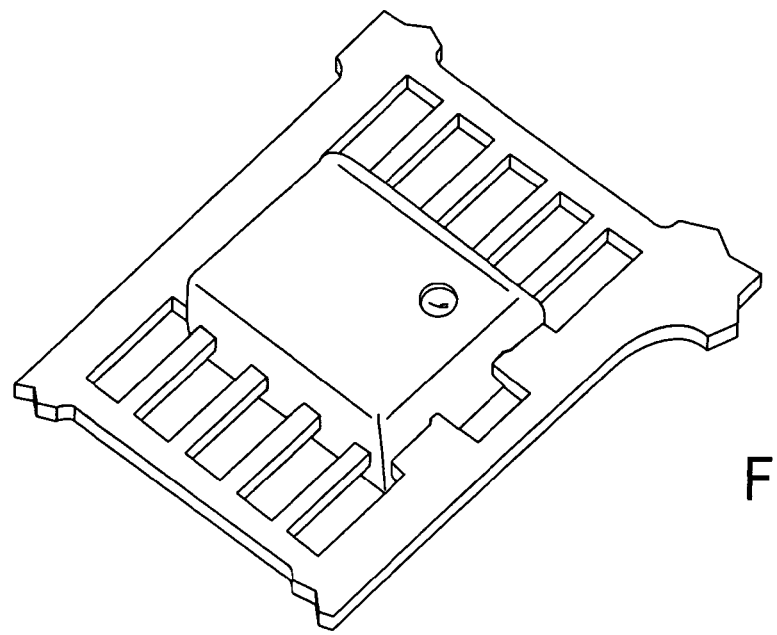

Referring to FIG. 2(C), a debar process may also be performed. In a debar process, excess molding material and leadframe material is removed. Referring to FIG. 2(E), a water deflash process is then performed. In this step, excess molding compound may be removed from the die package using a water jet.

Figure 2F:
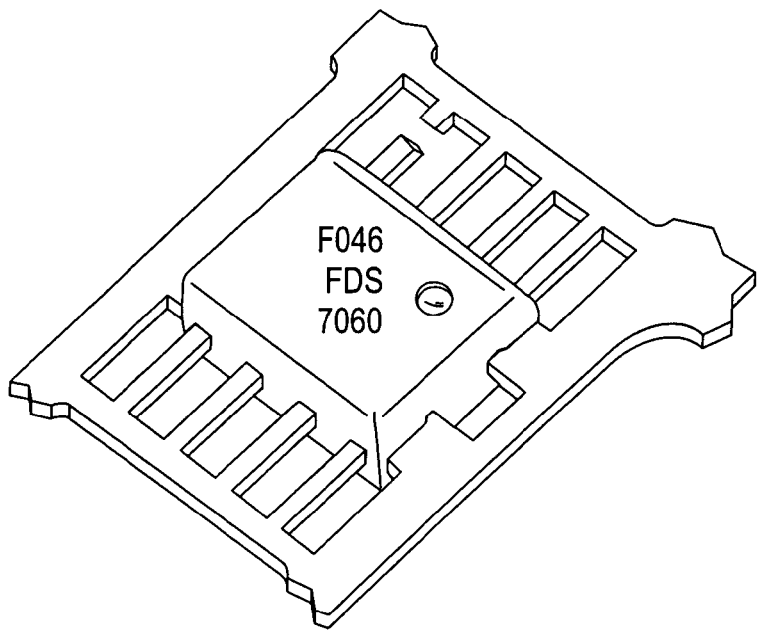

As shown in FIG. 2(F), a gate lead cut, strip test, and a laser mark process can be performed. The gate lead of the package can be severed so that the source leads and the gate lead are electrically isolated from each other. The package can then be tested, and then marked with appropriate identifying information.

Figure 2G:
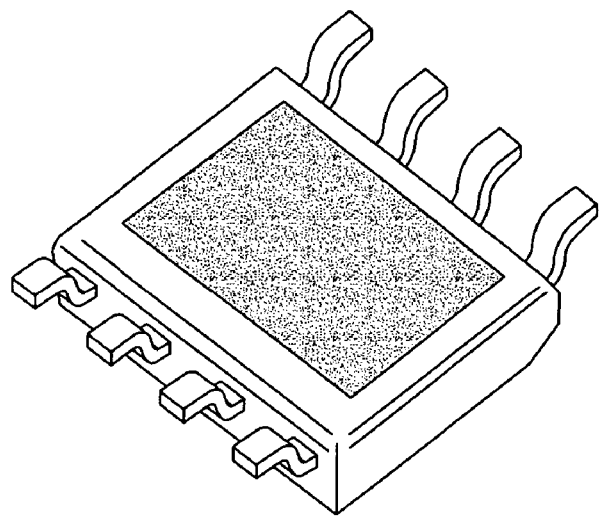
Figure 2H:
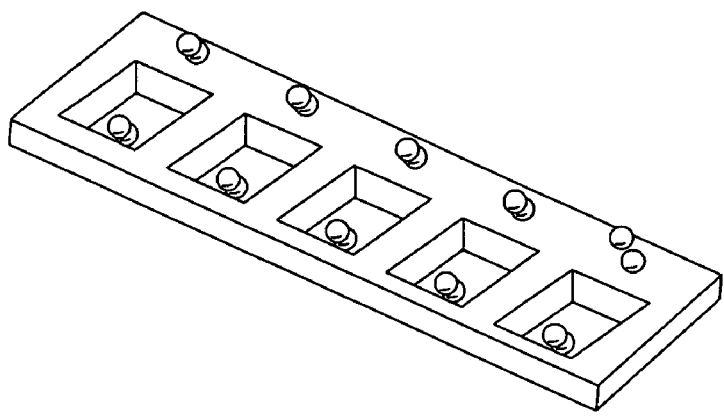

As shown in FIG. 2(G), a trim, form, and singulation process can then be performed. Last, a tape and reel process can be performed as shown in FIG. 2(H). Trim, form, singulation, and tape and reel processes are well known in the art.

Figure 3A:
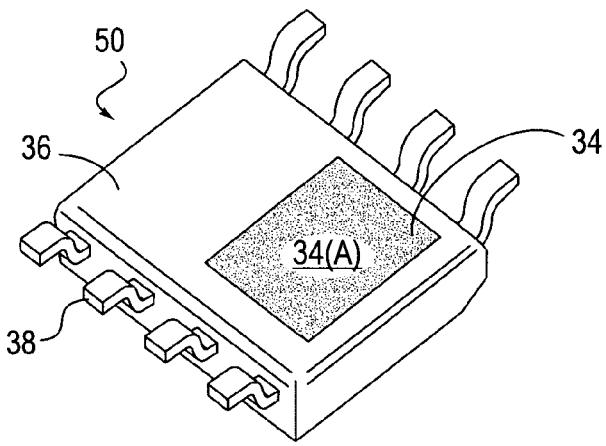

FIG. 3(A) shows a bottom view of a semiconductor die package 50 with a molding material 36 having an external bottom surface which is substantially flush with a first surface 34(A) of a semiconductor die 34. The first surface 34(A) may be part of a metallized backside of the die 34. The metal at the first surface 34(A) of the die 34 may comprise a solderable metal. Leads 38 extend laterally away from the molding material 36. As shown, the first surface 34(A) occupies less than half of the bottom surface of the package 50 in this example.

Figure 3B:
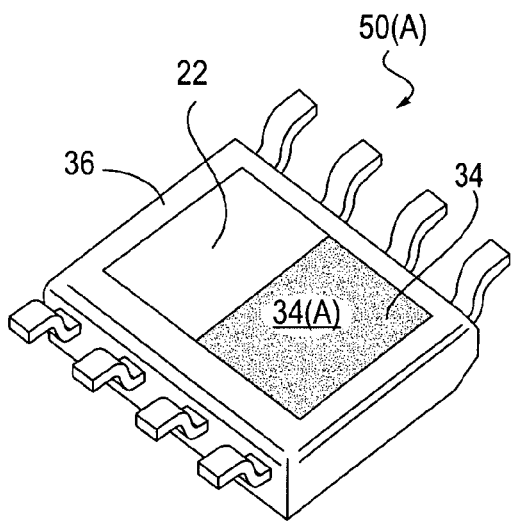
Figure 3C:
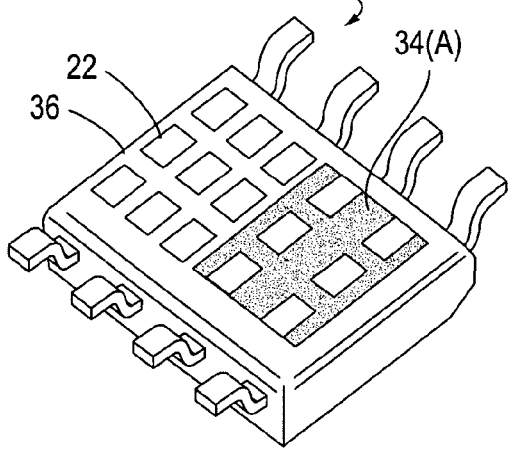
Figure 3D:
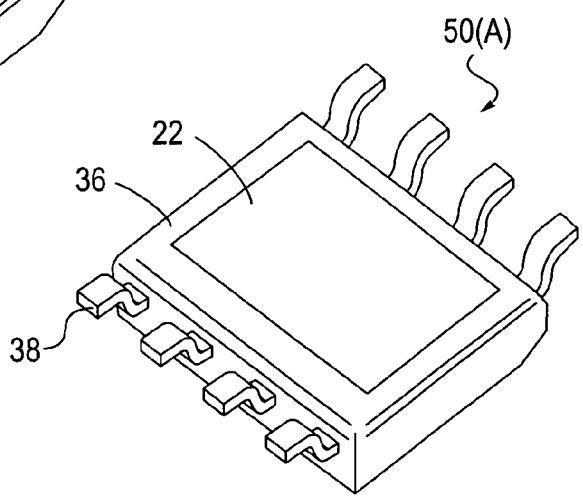

FIGS. 3(B)-3(D) show bottom perspective views of semiconductor die packages with solderable layers.

FIG. 3(B) shows a die package 50(A) including a solderable layer 22 (e.g., a cured solderable ink) that covers the exterior surface of the molding material 36, but does not cover the exposed first surface 34(A) of the die 34 or only covers a small portion of the first surface 34(A). When mounting the die package 50(A) to a circuit board, solder (not shown) can contact both the first surface 34(A) and the solderable layer 22.

FIG. 3(C) shows a die package 50(A) including a solderable layer 22 that covers both the first surface 34(A) of the die 34 and the molding material 36. In this example, the solderable layer 22 is discontinuous, rather than continuous.

FIG. 3(D) shows a die package 50(A) that includes a solderable layer 22 formed on both the first surface 34(A) of the die 34 and the molding material 36 In this example, the solderable layer 22 is a continuous layer rather than a discontinuous layer.

FIG. 4(A) shows a die package 50 with a die 34 having a first surface 34(A) that is exposed through a molding material 36. In this example, the first surface 34(A) of the die 34 occupies more than half of the bottom surface of the package 50.

FIG. 4(B) shows a die package 50(A) with a die 34 having a first surface 34(A) that is smaller than the first surface 34(A) of the die shown in FIG. 4(A). To make the footprint of the die package 50(B) in FIG. 4(B) the same as the footprint of the die package 50(A) in FIG. 4(A), a solderable layer 22 is formed on the exterior surface of the molding material 36 in the die package 50 shown in FIG. 4(B). Thus, the die packages 50, 50(a) in FIGS. 4(A) and 4(B) may have the same footprint, but may have different sized dies 34.

FIG. 4(C) shows the die packages 50, 50(A) shown in FIGS. 4(A) and 4(B) being mounted on a printed circuit board 60. Solder 70 is disposed on conductive lands (not shown) on the printed circuit board 60. As shown in FIG. 4(C), the amount of solder 70 that is used is the same for both packages 50, 50(A), even though the packages 50, 50(A) contain different sized dies. Together, the printed circuit board 60 and a die package according to an embodiment of the invention may form an electrical assembly.

Figure 5A:
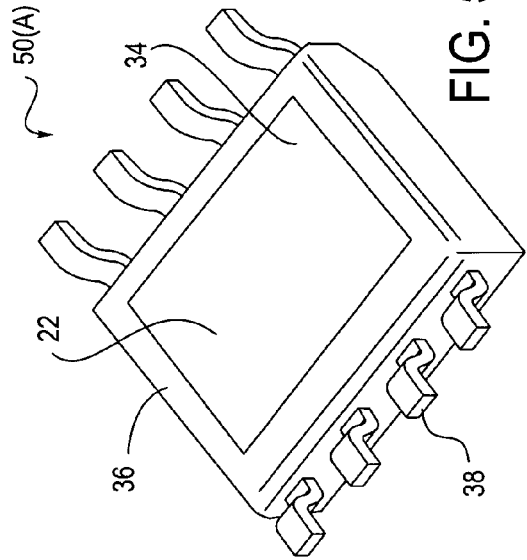
FIGS. 5(A)-5(B) show bottom perspective views of die packages.

FIG. 5(A) shows a die package 50 without a solderable layer on it. The die package 50 includes a molding material 36 which exposes a first surface 34(A) of a semiconductor die 34. Leads 38 extend laterally outward from the molding material 36.

Figure 5B:
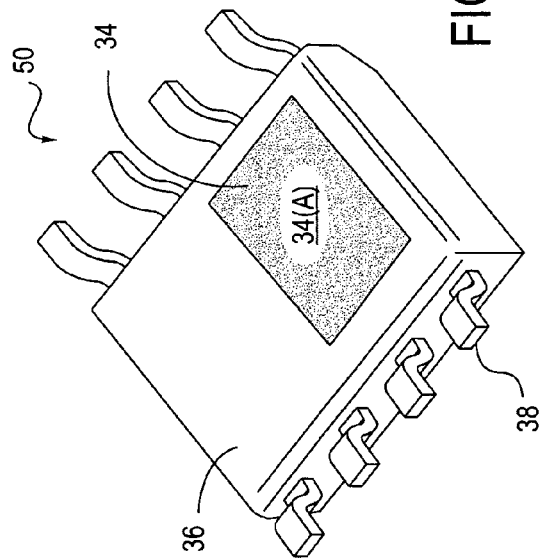
Figure 5C:
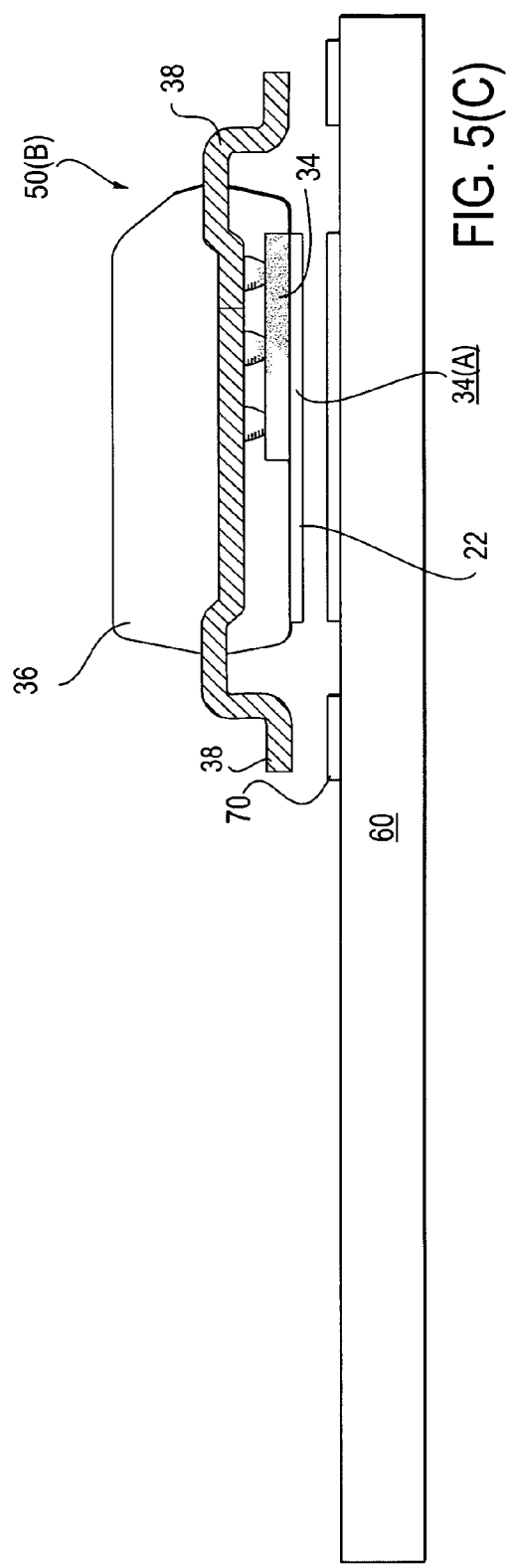
FIG. 5(C) shows a side cross-sectional view of the die package shown in FIG. 5(B) being mounted on a printed circuit board.

FIG. 5(B) shows a die package 50(A) including a molding material 36 and a solderable layer 22 on both the first surface 34(A) of a die 34 and the molding material 36. The die 34 in FIG. 5(B) is the same size as the die 34 in FIG. 5(A). As shown in FIG. 5(C), the die package 50(A) shown in FIG. 5(B) can be mounted on a printed circuit board 60. Solder 70 may be present on the printed circuit board 60.

FIGS. 6(A) and 6(B) show other packages 51(A), 51(B) with discontinuous solderable layers 22. The die package 51(A) shown in FIG. 6(A) has a larger die 34 than the die 34 in the die package 51(B) shown in FIG. 6(B). In FIGS. 6(A) and 6(B), the discontinuous solderable layers 22 are in the form of patterned rectangles. Other patterns could be used in other embodiments.

FIG. 7(A) shows how the die packages 51(A), 51(B) can be mounted on a printed circuit board 60 using solder 70. As shown, the amount of solder 70 that is used to mount both packages 51(A), 51(B) is the same, even though different sized dies 34 are used. FIG. 7(B) shows the die packages 51(A), 51(B) after being mounted on a printed circuit board. At reference number 170, the solder 70 does not wet to the bottom surface of the molding material 36.

Figure 8B:
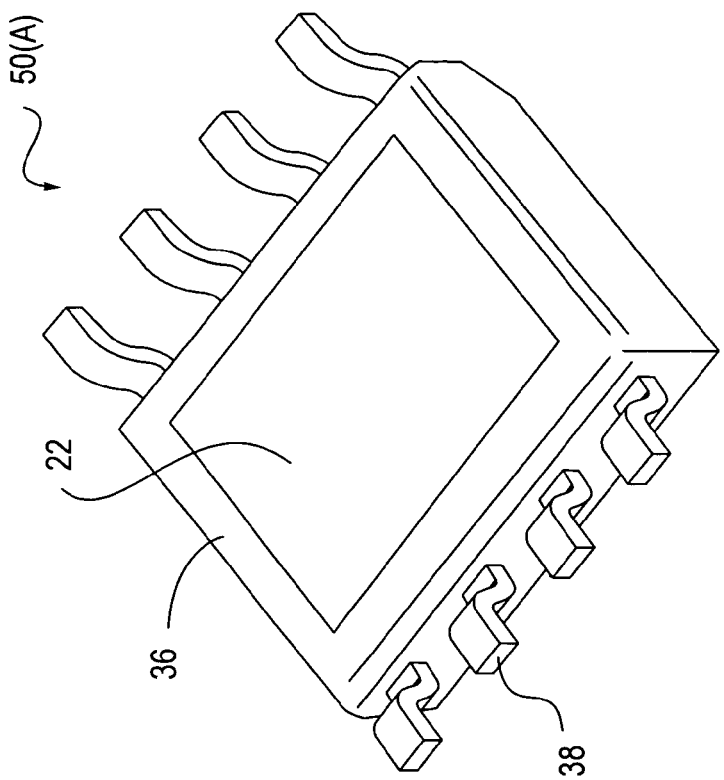
FIGS. 8(A)-8(B), 9(A)-9(B), and 10(A)-10(B) show bottom perspective views of die packages.
Figure 8A:
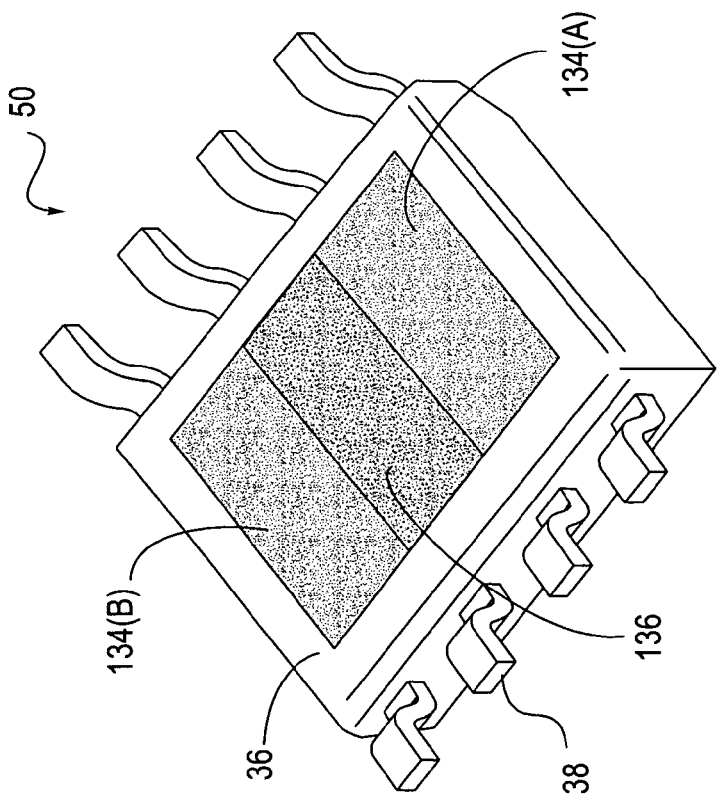

FIG. 8(A) shows a die package 50 including two dies with two die surfaces 134(A), 134(B) being exposed through a molding material 36. An electrically insulating region 136 may be present between the two dies. As shown in FIG. 8(B), a solderable layer 22 covers both die surfaces 134(A), 134(B) so that they are electrically coupled together. The die surfaces 134 (A), 134(B) may correspond to drain regions of MOSFETs in the dies, and the solderable layer 22 may form a common drain terminal.

Figure 9B:
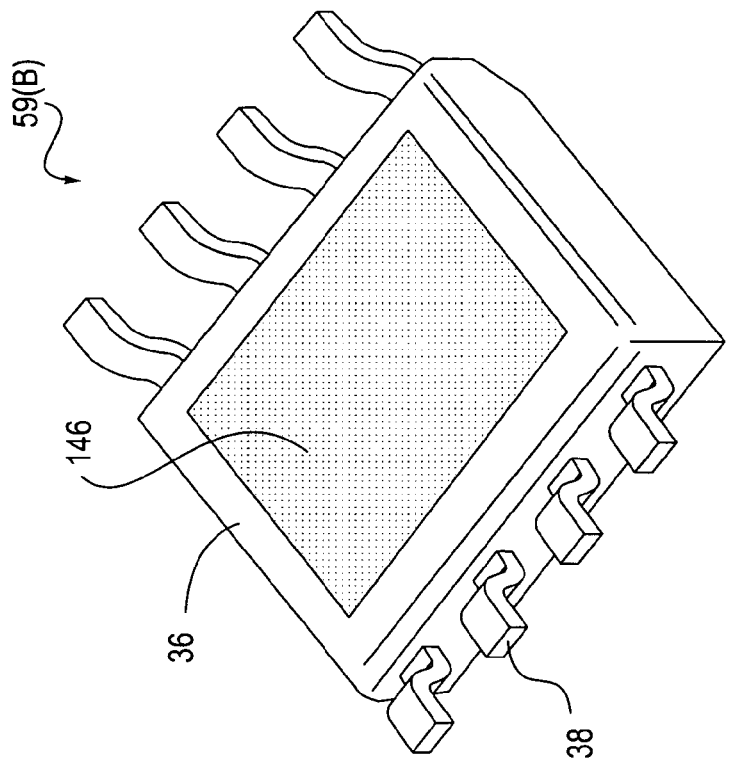
Figure 9A:
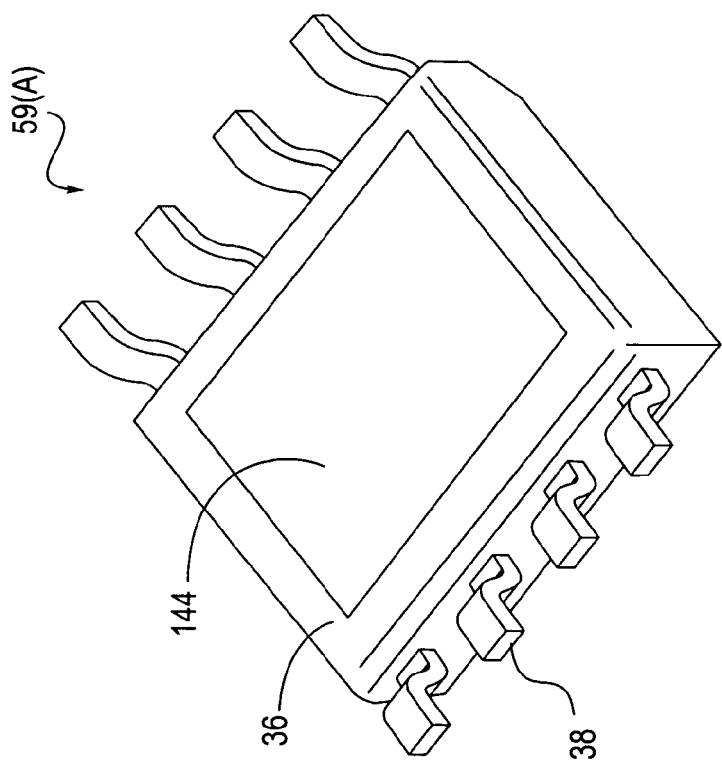

FIG. 9(A) shows a die package 59(A) with a non-solderable polymer layer 144. FIG. 9(B) shows a die package 59(B) after forming a solderable layer 146 on the non-solderable polymer layer 144. The solderable layer 146 can be formed by plating, evaporation, sputtering, etc.

Figure 10B:
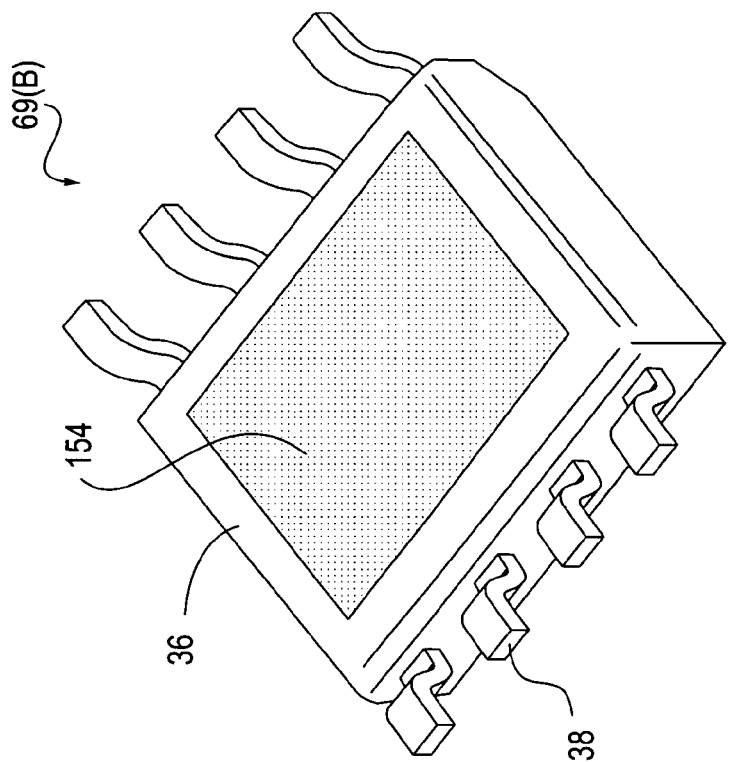
Figure 10A:
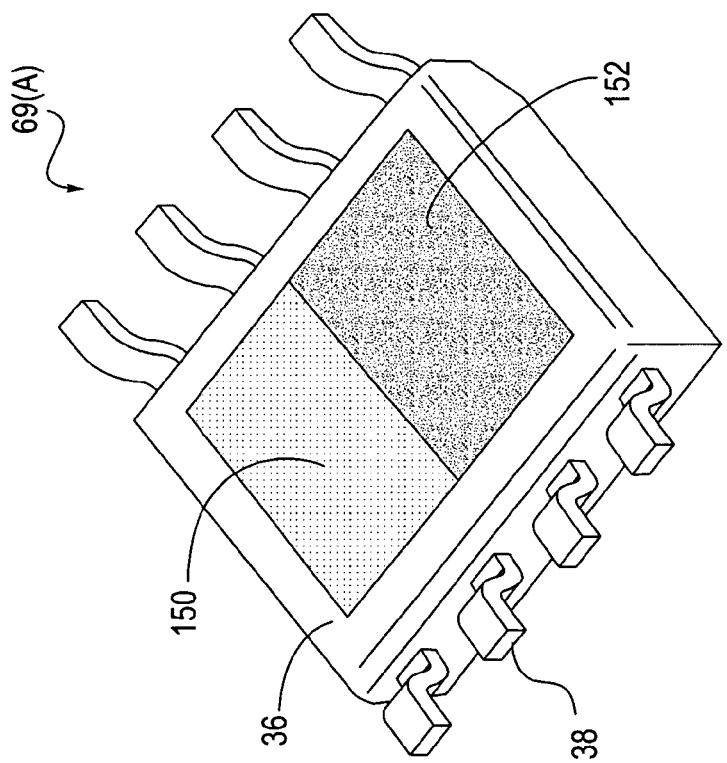

FIG. 10(A) shows a die package 69(A) including a sputtered seed layer 150, and a die backside 152 that is exposed through the molding material 36. FIG. 10(B) shows a die package 69(B) after forming a solderable interface layer 154 on the seed layer 154. The solderable interface layer 154 may be plated on the non-solderable layer 150.

FIG. 11 shows a semiconductor die package 200 including a molding material 238 which surrounds the sides of a die 234. A die surface 234(A) may form a drain terminal of a MOSFET in the die 234, and is exposed through the molding material 238. The surface 234(A) may be substantially co-planar with the top exterior surface of the molding material 238. Interconnects (e.g., solder joints) 236 couple the die 234 to a leadframe structure 240. Leads 240 extend laterally outward from the molding material 238.

A solderable and/or conductive layer 224 may provide an external drain connection between the exposed die surface 234(A) and one or more of the leads 240. The exposed surface 234(A) of the die 234 is electrically coupled to one or more of the leads 240 so that drain current can be routed from the die surface 234(A) to a circuit board 60. Solder 70 is used to couple the leads 240 to the circuit board 60.

Another solderable and/or conductive layer 222 may be on top of the die package 200. As previously described, the solderable and/or conductive layer 222 can be continuous, or discontinuous, and may cover some or substantially all of the upper exterior surface of the package 200. Solder or a thermal adhesive (not shown) may be deposited on the top of the die surface 234(A) and the solderable and/or conductive layer 222. A heatsink HS can then be attached to the solder on top of the die package to cool the die package 200. The heatsink HS may comprise a metal such as aluminum or copper, and may or may not include heat dissipating fins.

The embodiment shown in FIG. 11 differs from the previously described embodiments. In FIG. 11, the die 234 is on top of a leadframe structure instead on the bottom of a leadframe structure. Moreover, unlike the prior embodiments, the die 234 is not in close proximity to a circuit board. Although the embodiment in FIG. 11 is different than the previously described embodiments, it is apparent that the embodiment in FIG. 11 can be adapted to form die packages with a universal footprint, even though dies in the die packages may have differently sized dies.

FIGS. 12 and 13 show side cross-sectional views other embodiments of the invention. In FIGS. 11, 12, and 13, like numerals designate like elements, and the descriptions of some elements in FIGS. 12 and 13 are not repeated.

FIG. 12 shows a die package 200 mounted on a circuit board 60. The die package 200 in this example has a die 234 with a surface 234(A) that is substantially coplanar with an outer surface 238(A) of a molding material 238. A solderable and/or conductive layer 224 may at least partially cover the die surface 234(A) and at least a portion of the molding material 238. The solderable and/or conductive layer 224 can couple one or more leads 240 of a leadframe structure to the die 234. Unlike the embodiment in FIG. 11, the solderable and/or conductive layer 224 is at the bottom of the package 200, rather than at the top.

FIG. 13 shows a die package 200 that has a die surface 234(A) of a die 234 that is substantially coplanar with an outer surface 238(A) of a molding material 238. A solderable and/or conductive layer 222 may be on top of the die package 200 and may couple a heat sink HS to the molding material 238. Another solderable and/or conductive layer 224 may be at the bottom of the package 200 and may couple the die surface 234(A) (which may form a drain region) to the circuit board 60. Unlike the prior embodiments in FIGS. 11 and 12, the embodiment in FIG. 13 has a heat sink HS and has an exposed die surface 234(A) at the bottom of the package 200.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention. For example, any of the features described with respect to FIGS. 3-10 may be incorporated or used with the features in FIG. 11 without departing from the scope of the invention.

All patents, patent applications, publications, and descriptions mentioned above are herein incorporated by reference in their entirety for all purposes. None is admitted to be prior art.

What is claimed is:

1. A semiconductor die package comprising:
   a semiconductor die having a first surface and a second surface;
   a leadframe structure, wherein the semiconductor die is coupled to the leadframe structure;
   a molding material formed around at least a portion of the die and at least a portion of the leadframe structure, and having an exterior surface, wherein the first surface of the semiconductor die is substantially flush with at least part of the exterior surface of the molding material; and
   a solderable layer on at least a portion of the exterior surface of the molding material,
   wherein the solderable layer is in contact with the molding material.

2. The semiconductor die package of claim 1 wherein the solderable layer is formed using sputtering, evaporating, screen printing, pad printing, plating, or any combination thereof.

3. The semiconductor die package of claim 1 wherein the solderable layer comprises a conducting ink layer.

4. The semiconductor die package of claim 1 wherein the semiconductor die comprises a vertical power transistor.

5. The semiconductor die package of claim 1 wherein the semiconductor die comprises a drain region at the first surface and a source and gate region at the second surface.

6. The semiconductor die package of claim 1 wherein the leadframe structure includes multiple leads extending laterally away from the molding material.

7. The semiconductor die package of claim 1 wherein the solderable layer comprises a metal layer.

8. The semiconductor die package of claim 1 wherein the solderable layer has a thickness less than about 100 microns.

9. The semiconductor die package of claim 1 wherein the solderable layer comprises a plurality of conductive layers.

10. An electrical assembly comprising:
    the semiconductor die package of claim 1; and
    a circuit board, wherein the semiconductor die package is mounted to the circuit board.

11. The semiconductor die package of claim 1 wherein the first surface forms an electrical terminal of a device in the semiconductor die.

12. A method comprising:
    providing a semiconductor die having a first surface and a second surface;
    attaching the semiconductor die to a leadframe structure, wherein the semiconductor die is coupled to the leadframe structure;
    forming a molding material around at least a portion of the die and at least a portion of the leadframe structure, wherein the formed molding material includes an exterior surface, and wherein the first surface of the semiconductor die is substantially flush with at least part of the exterior surface of the molding material;

forming a solderable layer on at least a portion of the exterior surface of the molding material; and depositing solder on the solderable layer, and wherein the solderable layer is in contact with the molding material.

13. The method of claim 12 wherein forming the solderable layer comprises sputtering, evaporating, screen printing, pad printing, plating, or any combination thereof.

14. The method of claim 12 wherein the semiconductor die comprises a vertical power transistor.

15. The method of claim 12 wherein the first surface of the semiconductor die comprises a drain region and the second surface of the semiconductor die comprises a source region and a gate region.

16. The method of claim 12 wherein molding material comprises a plastic material.

17. The method of claim 12 wherein the solderable layer covers at least part of the first surface of the semiconductor die.

* * * * *